United States Patent
Lee et al.

(10) Patent No.: US 11,127,692 B2
(45) Date of Patent: Sep. 21, 2021

(54) SEMICONDUCTOR PACKAGE

(71) Applicant: SAMSUNG ELECTRONICS CO., LTD., Suwon-si (KR)

(72) Inventors: Gun Lee, Suwon-si (KR); Jun Gul Hwang, Suwon-si (KR); Ji Eun Woo, Suwon-si (KR); Sung Keun Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 141 days.

(21) Appl. No.: 16/393,073

(22) Filed: Apr. 24, 2019

(65) Prior Publication Data
US 2020/0168562 A1 May 28, 2020

(30) Foreign Application Priority Data
Nov. 23, 2018 (KR) .................. 10-2018-0146215

(51) Int. Cl.
| | |
|---|---|
| *H01L 23/48* | (2006.01) |
| *H01L 23/00* | (2006.01) |
| *H01L 23/31* | (2006.01) |
| *H01L 23/538* | (2006.01) |
| *H01L 23/552* | (2006.01) |
| *H01L 23/485* | (2006.01) |

(52) U.S. Cl.
CPC ........ *H01L 23/562* (2013.01); *H01L 23/3128* (2013.01); *H01L 23/485* (2013.01); *H01L 23/5383* (2013.01); *H01L 23/5386* (2013.01); *H01L 23/5389* (2013.01); *H01L 23/552* (2013.01); *H01L 24/20* (2013.01); *H01L 2224/214* (2013.01); *H01L 2924/3025* (2013.01)

(58) Field of Classification Search
CPC . H01L 23/562; H01L 23/485; H01L 23/5383; H01L 23/5386; H01L 23/5389; H01L 23/49816; H01L 23/3142; H01L 2224/0233; H01L 23/3128; H01L 23/552; H01L 24/20; H01L 2224/214; H01L 2224/023
See application file for complete search history.

(56) References Cited

U.S. PATENT DOCUMENTS

| | | | |
|---|---|---|---|
| 10,083,926 B1 * | 9/2018 | Kent | H01L 23/3192 |
| 2005/0186406 A1 * | 8/2005 | Harada | H05K 1/0242 |
| | | | 428/209 |
| 2011/0204403 A1 * | 8/2011 | Kim | H01L 33/382 |
| | | | 257/98 |

(Continued)

FOREIGN PATENT DOCUMENTS

KR    10-2014-0060767 A    5/2014

*Primary Examiner* — Charles D Garber
*Assistant Examiner* — S M Sohel Imtiaz
(74) *Attorney, Agent, or Firm* — Sughrue Mion, PLLC

(57) ABSTRACT

A semiconductor package includes a semiconductor chip, and a connection structure disposed on at least one side of the semiconductor chip, and including an insulating layer and a redistribution layer electrically connected to the semiconductor chip, wherein the redistribution layer includes a plurality of conductive patterns, and at least two of the plurality of conductive patterns have different degrees of surface roughness, and a conductive pattern having a higher surface roughness has a width wider than a width of a conductive pattern having a lower surface roughness.

12 Claims, 14 Drawing Sheets

(56) References Cited

U.S. PATENT DOCUMENTS

| | | | |
|---|---|---|---|
| 2012/0118871 A1* | 5/2012 | Huang | H05B 3/265 |
| | | | 219/538 |
| 2014/0131068 A1* | 5/2014 | Kim | H05K 3/46 |
| | | | 174/251 |
| 2016/0020163 A1* | 1/2016 | Shimizu | H01L 23/49822 |
| | | | 361/768 |
| 2017/0084558 A1* | 3/2017 | Seo | H01L 23/3171 |
| 2017/0162540 A1* | 6/2017 | Ji | H01L 24/05 |
| 2018/0337117 A1* | 11/2018 | Nishihara | H01L 21/4857 |

* cited by examiner

SEMICONDUCTOR PACKAGE

CROSS-REFERENCE TO RELATED APPLICATION(S)

This application claims benefit of priority to Korean Patent Application No. 10-2018-0146215 filed on Nov. 23, 2018 in the Korean Intellectual Property Office, the disclosure of which is incorporated herein by reference in its entirety.

TECHNICAL FIELD

The present disclosure relates to a semiconductor package, and more particularly, to a fan-out semiconductor package in which electrical connection structures may extend outwardly of a region in which a semiconductor chip is disposed.

BACKGROUND

A significant recent trend in the development of technology related to semiconductor chips has been to reduce the size of semiconductor chips. Therefore, in the field of package technology, in accordance with a rapid increase in demand for small-sized semiconductor chips, or the like, the implementation of a semiconductor package having a compact size while including a plurality of pins has been demanded.

One type of semiconductor package technology suggested to satisfy the technical demand as described above is a fan-out semiconductor package. Such a fan-out package has a compact size and may allow a plurality of pins to be implemented by redistributing connection terminals outwardly of a region in which a semiconductor chip is disposed.

Meanwhile, by observing a wiring design of the semiconductor package, ground patterns disposed for the purpose of heat dissipation, signal return, and the like, in addition to signal patterns which are microcircuits for signal transmission purpose may be confirmed. In a case of a grounded region, since a copper foil remaining ratio is very high, adhesion with an insulating layer is lowered, and as a result, there may be problems such as interlayer delamination.

SUMMARY

An aspect of the present disclosure may provide a semiconductor package in which coupling force between a redistribution layer and an insulating layer is enhanced and structural stability may be improved.

According to an aspect of the present disclosure, a semiconductor package may include a semiconductor chip, and a connection structure disposed on at least one side of the semiconductor chip, and including a first insulating layer and a redistribution layer electrically connected to the semiconductor chip. The redistribution layer may include a plurality of conductive patterns, and at least two of the plurality of conductive patterns may have different degrees of surface roughness, and a conductive pattern having a higher surface roughness may have a width wider than a width of a conductive pattern having a lower surface roughness.

The plurality of conductive patterns may include a signal pattern and a ground pattern, and a surface roughness of the ground pattern may be greater than a surface roughness of the signal pattern.

Only a surface of the conductive pattern having the higher surface roughness among the surface of the conductive pattern having the higher surface roughness and a surface of the conductive pattern having the lower surface roughness has an irregular concave-convex structure.

The irregular concave-convex structure may be a surface-etched irregular structure.

A surface of the conductive pattern having the higher surface roughness on which the surface roughness may be in contact with the first insulating layer.

A surface roughness of a surface opposing the surface of the conductive pattern having the higher surface roughness may be lower than the surface roughness of the surface of the conductive pattern having the higher surface roughness.

The surface of the conductive pattern having the higher surface roughness may be disposed further from the semiconductor chip than the opposing surface.

The conductive pattern having the higher surface roughness may have a flat plate shape.

The surface of the conductive pattern having the higher surface roughness and side surfaces of the conductive pattern having the higher surface roughness may be embedded in the first insulating layer, and the opposing surface may be in contact with a second insulating layer of the connection structure.

According to another aspect of the present disclosure, a semiconductor package may include a semiconductor chip, and a connection structure disposed on at least one side of the semiconductor chip, and including a first insulating layer and a redistribution layer electrically connected to the semiconductor chip. The redistribution layer may include a plurality of conductive patterns, and at least portions of surfaces of the plurality of conductive patterns which are in contact with the first insulating layer have a regular concave-convex structure.

A size of each of the regular concave-convex structure may be 1 µm or less.

A surface opposing surfaces of the plurality of conductive patterns which have the regular concave-convex structure may not include a regular concave-convex structure.

The surfaces of the plurality of conductive patterns on which the regular concave-convex structure is formed may be disposed further from the semiconductor chip than the opposing surface.

The surfaces of the plurality of conductive patterns which have the regular concave-convex structure, and side surfaces of the plurality of conductive patterns may be embedded in the first insulating layer, and the opposing surface may be in contact with a second insulating layer of the connection structure.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Electronic Device

Figure 1:
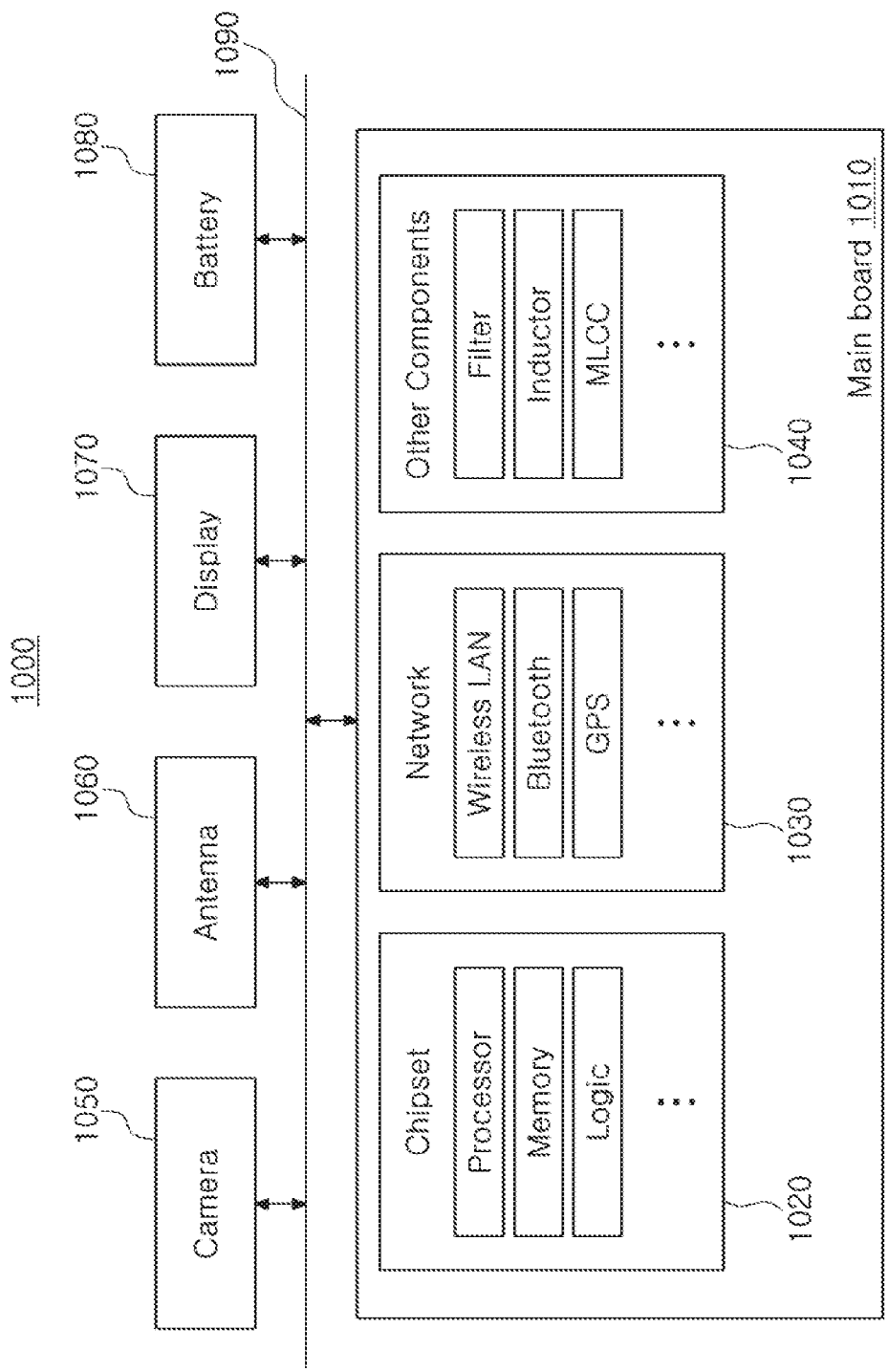
FIG. 1 is a schematic block diagram illustrating an example of an electronic device system.

FIG. 1 is a schematic block diagram illustrating an example of an electronic device system.

Referring to FIG. 1, an electronic device 1000 may accommodate a main board 1010 therein. The main board 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter (ADC), an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-firing ceramic (LTCC), an electromagnetic interference (EMI) filter, a multilayer ceramic capacitor (MLCC), and the like. However, other components 1040 are not limited thereto, and may also include passive components used for various other purposes, and the like. In addition, other components 1040 may be combined with each other, together with the chip related components 1020 or the network related components 1030 described above.

Depending on a type of the electronic device 1000, the electronic device 1000 may include other components that may or may not be physically and/or electrically connected to the main board 1010. These other components may include, for example, a camera 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet personal computer (PC), a laptop PC, a netbook PC, a television, a video game machine, a smartwatch, an automotive, or the like. However, the electronic device 1000 is not limited thereto, but may be any other electronic device processing data.

Figure 2:
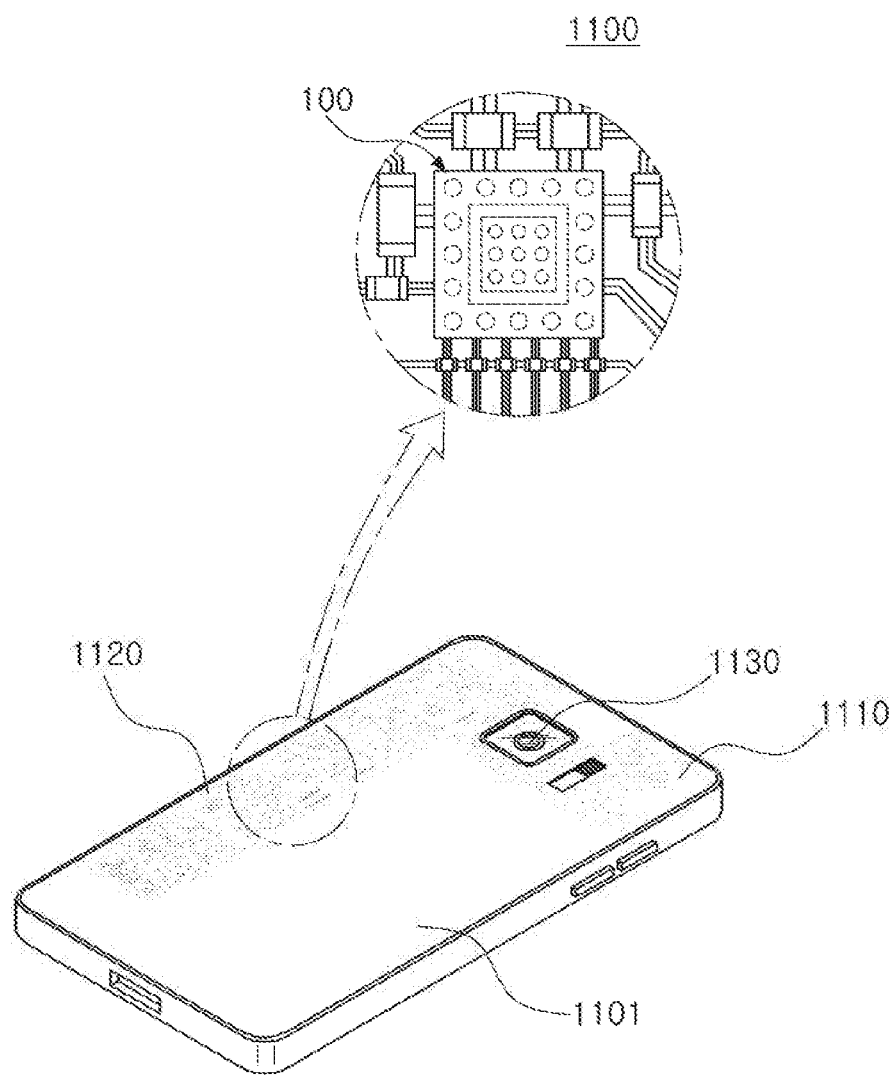
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a mother board 1110 may be accommodated in a body 1101 of a smartphone 1100, and various components 1120 may be physically or electrically connected to the mother board 1110. In addition, other components that may or may not be physically and/or electrically connected to the main board 1010, such as a camera 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a main board of the electronic device in terms of electrical connections. In detail, a size of connection pads of the semiconductor chip and an interval between the connection pads of the semiconductor chip are very fine, but a size of component mounting pads of the main board used in the electronic device and an interval between the component mounting pads of the main board are significantly larger than those of the semiconductor chip. Therefore, it may be difficult to directly mount the semiconductor chip on the main board, and packaging technology for buffering a difference in a circuit width between the semiconductor chip and the main board is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

Figure 3B:
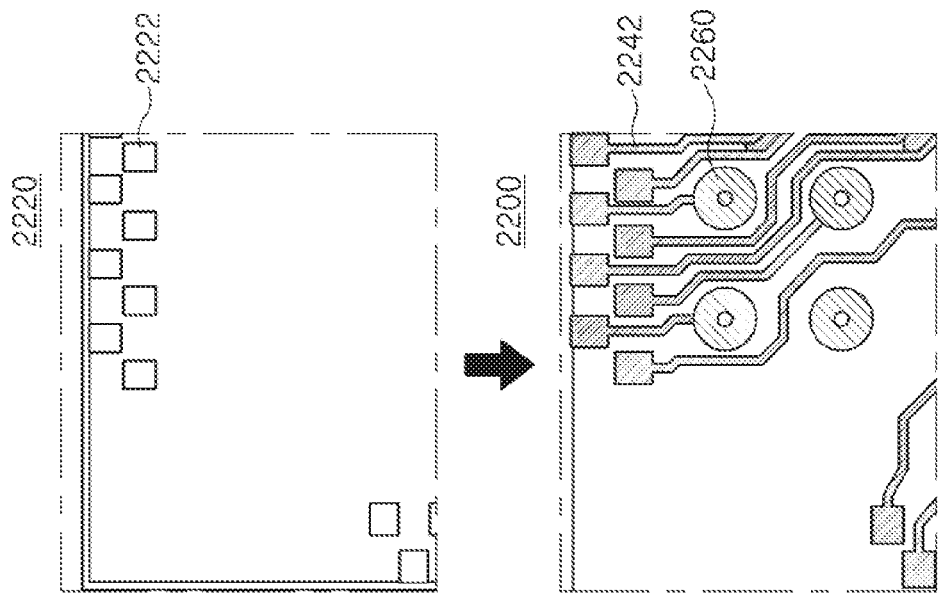
FIGS. 3A and 3B are schematic cross-sectional views illustrating states of a fan-in semiconductor package before and after being packaged.
Figure 3A:
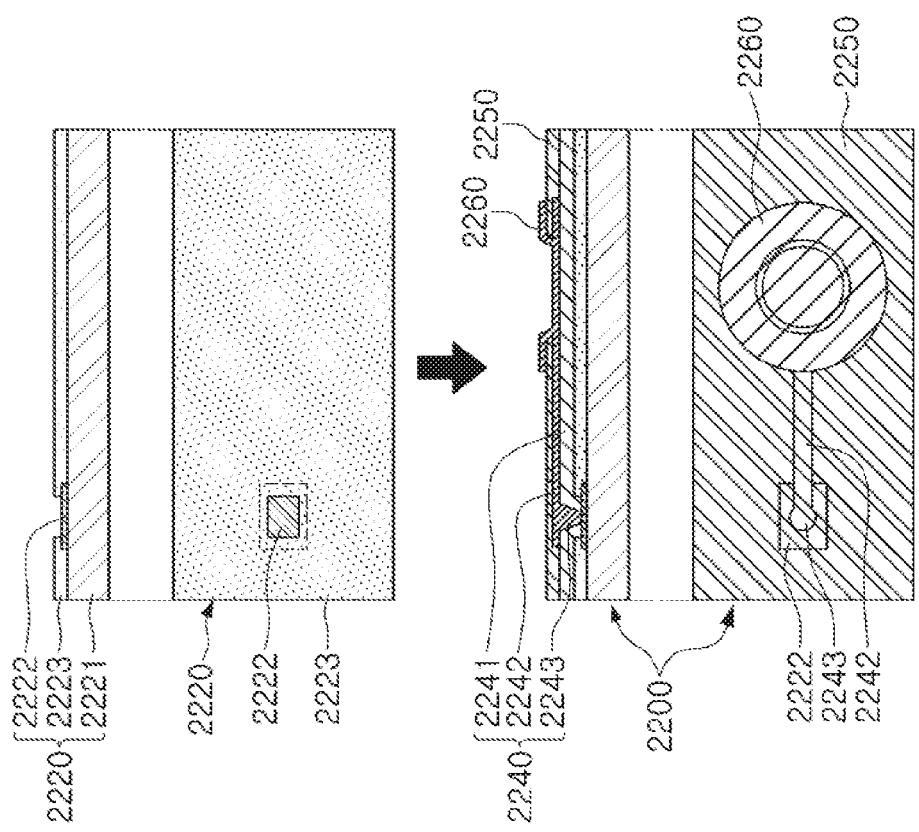

FIGS. 3A and 3B are schematic cross-sectional views illustrating states of a fan-in semiconductor package before and after being packaged.

Figure 4:
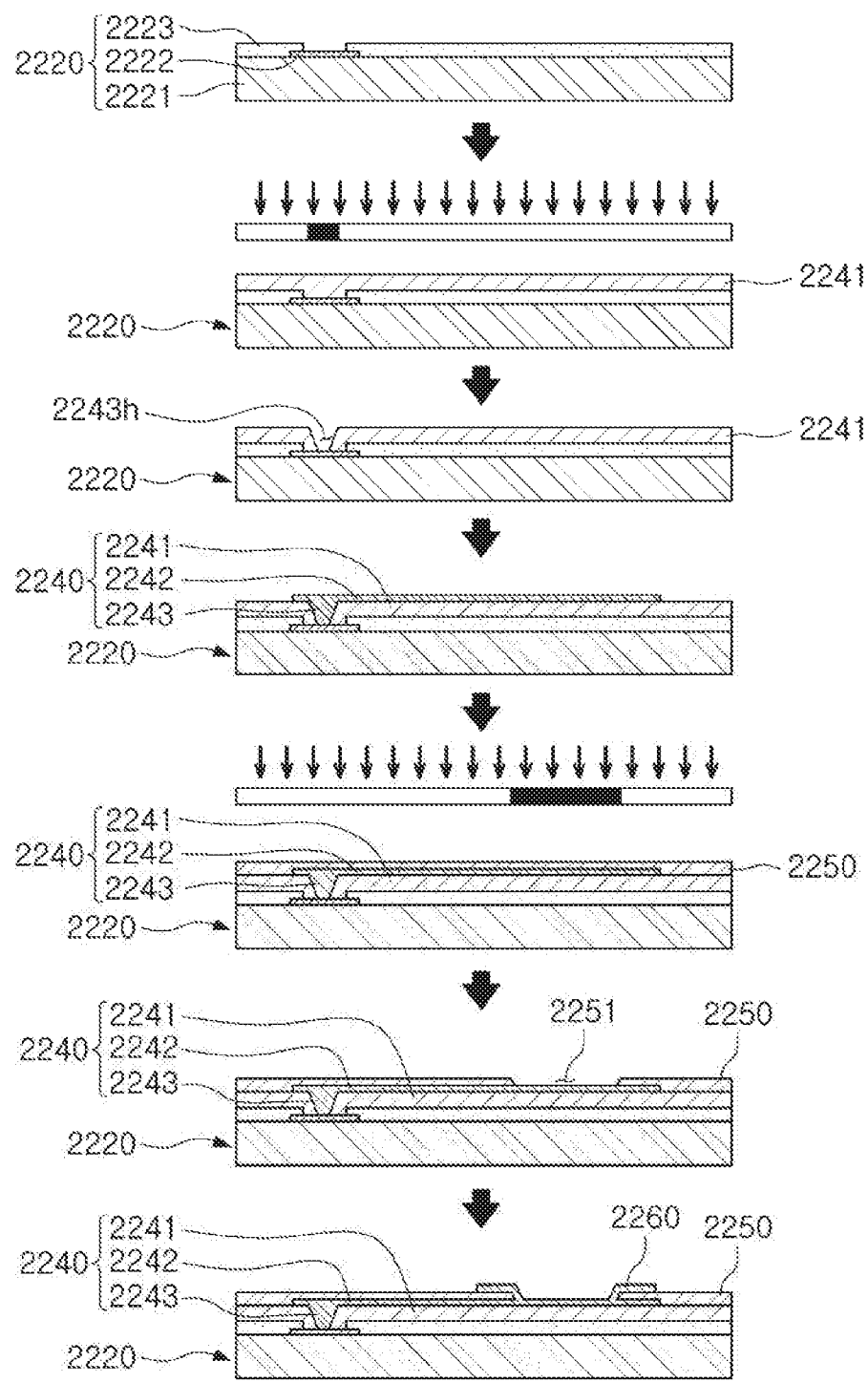
FIG. 4 is a schematic cross-sectional view illustrating a packaging process of a fan-in semiconductor package.

FIG. 4 is a schematic cross-sectional view illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it is difficult to mount the integrated circuit (IC) on an intermediate level printed circuit board (PCB) as well as on the main board of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as photo imagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the under-bump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has a large spatial limitation. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the main board of the electronic device. The reason is that even in a case that a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the main board of the electronic device.

Figure 5:
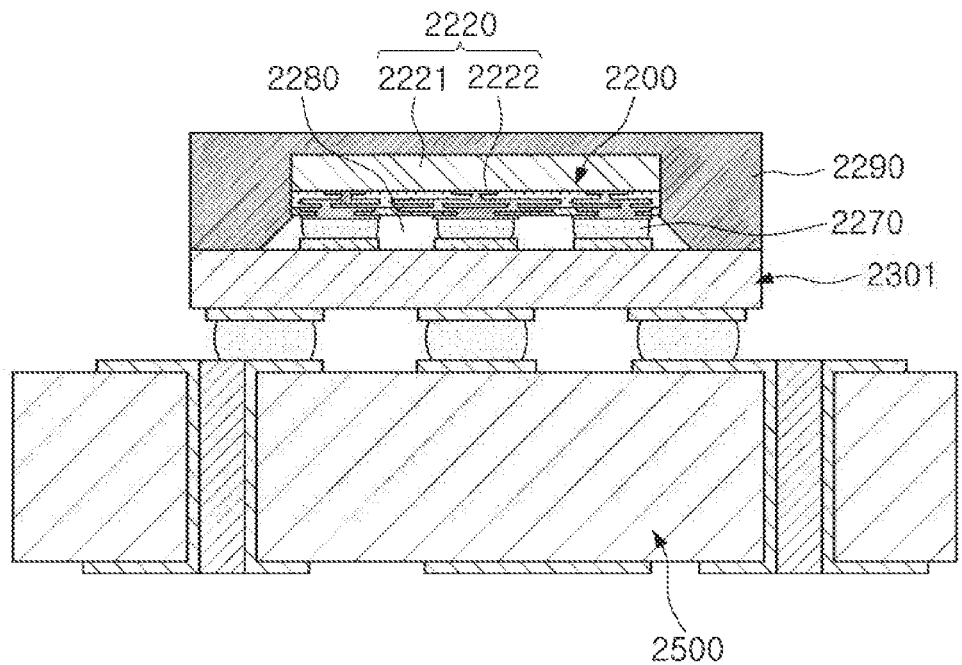
FIG. 5 is a schematic cross-sectional view illustrating a case in which a fan-in semiconductor package is mounted on an interposer substrate and is finally mounted on a main board of an electronic device.

FIG. 5 is a schematic cross-sectional view illustrating a case in which a fan-in semiconductor package is mounted on an interposer substrate and is finally mounted on a main board of an electronic device.

Figure 6:
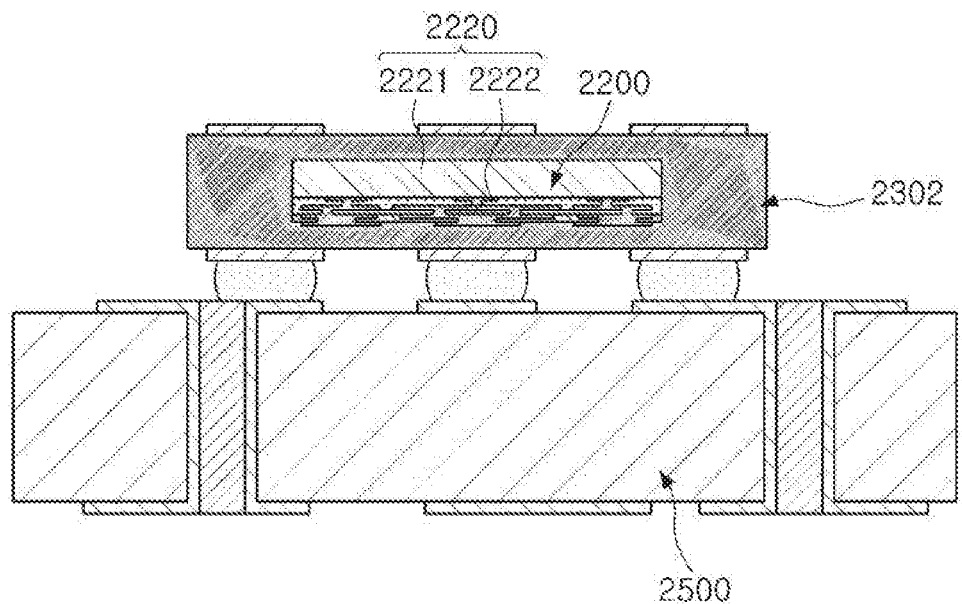
FIG. 6 is a schematic cross-sectional view illustrating a case in which a fan-in semiconductor package is embedded in an interposer substrate and is finally mounted on a main board of an electronic device.

FIG. 6 is a schematic cross-sectional view illustrating a case in which a fan-in semiconductor package is embedded in an interposer substrate and is finally mounted on a main board of an electronic device.

Referring to FIGS. 5 and 6, in a fan-in semiconductor package 2200, connection pads 2222, that is, I/O terminals, of a semiconductor chip 2220 may be redistributed through an interposer substrate 2301, and the fan-in semiconductor package 2200 may be finally mounted on a main board 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be finally mounted on a main board 2500 of an electronic device.

As described above, it may be difficult to directly mount and use the fan-in semiconductor package on the main board of the electronic device. Therefore, the fan-in semiconductor package may be mounted on the separate interposer substrate and be then mounted on the main board of the electronic device through a packaging process or may be mounted and used on the main board of the electronic device in a state in which it is embedded in the interposer substrate.

Fan-Out Semiconductor Package

Figure 7:
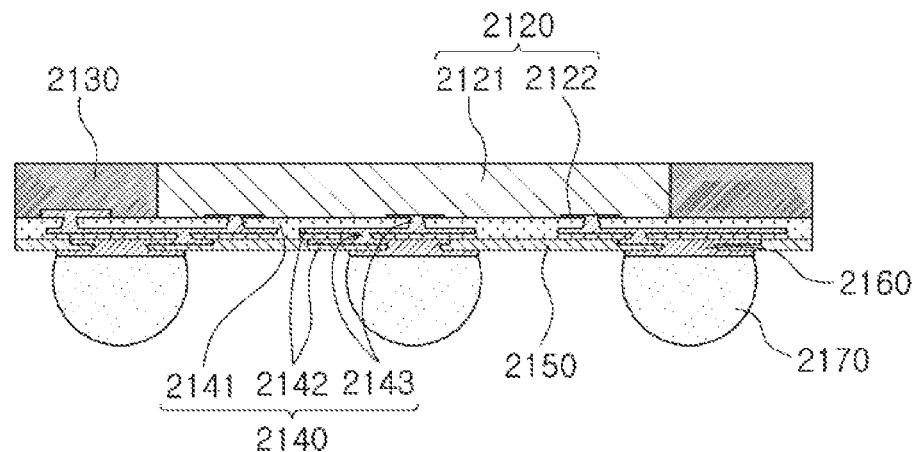
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2202 may be further formed on the connection member 2140, and an underbump metal layer 2160 may be further formed in openings of the passivation layer 2202. Solder balls 2170 may be further formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2241, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case that a size of the semiconductor chip is decreased, a standardized ball layout may be used in the fan-out semiconductor package as it is, such that the fan-out semiconductor package may be mounted on the main board of the electronic device without using a separate interposer substrate, as described below.

Figure 8:
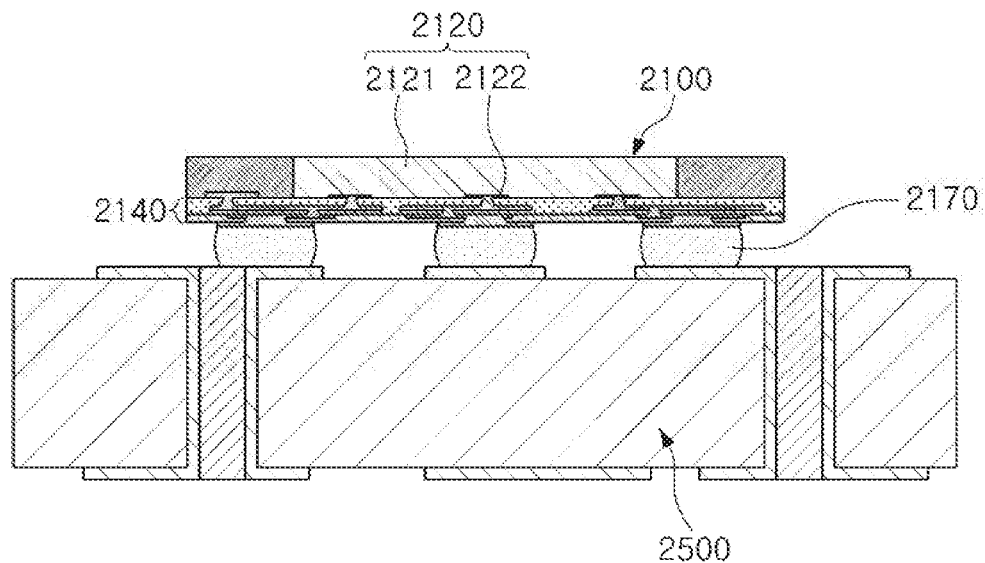
FIG. 8 is a schematic cross-sectional view illustrating a case in which a fan-out semiconductor package is mounted on a main board of an electronic device.

FIG. 8 is a schematic cross-sectional view illustrating a case in which a fan-out semiconductor package is mounted on a main board of an electronic device.

Referring to FIG. 8, a fan-out semiconductor package 2100 may be mounted on a main board 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the main board 2500 of the electronic device without using a separate interposer substrate, or the like.

As described above, since the fan-out semiconductor package may be mounted on the main board of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to occurrence of a warpage phenomenon.

Meanwhile, the fan-out semiconductor package refers to package technology for mounting the semiconductor chip on the main board of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

A fan-out semiconductor package according to exemplary embodiment in the present disclosure will hereinafter be described with reference to the drawings.

Figure 9:
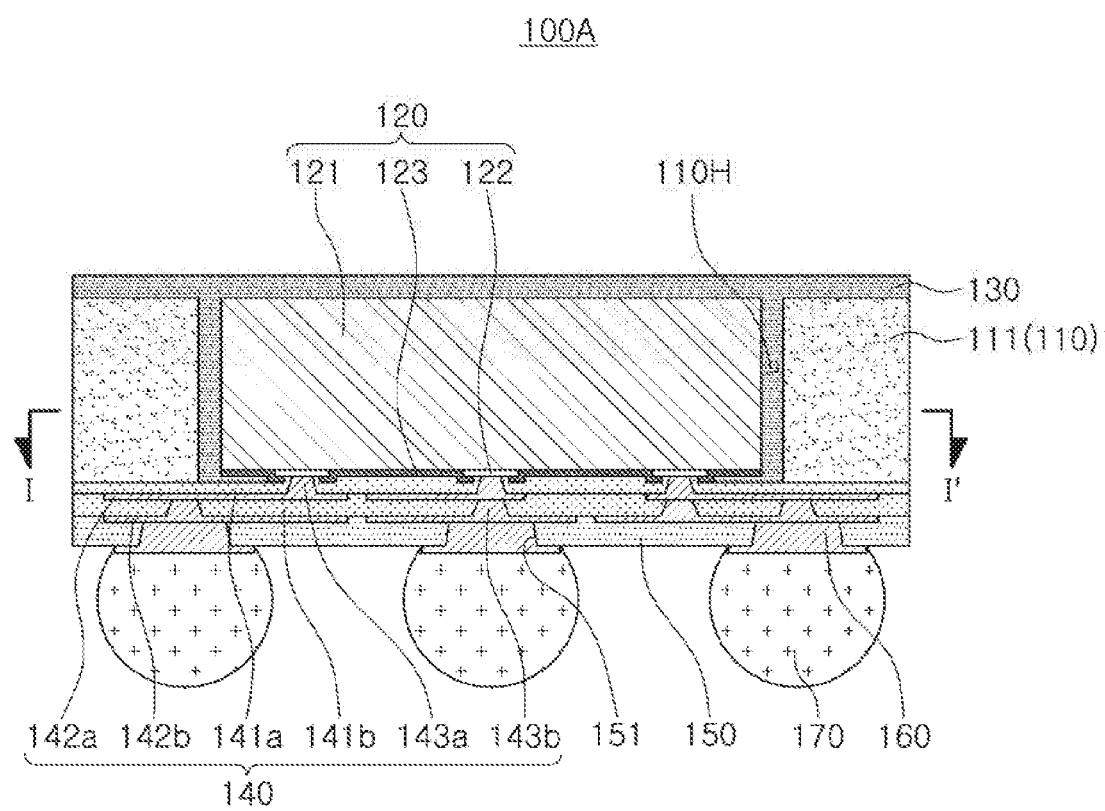
FIG. 9 is a schematic cross-sectional view illustrating an example of a semiconductor package.
Figure 10:
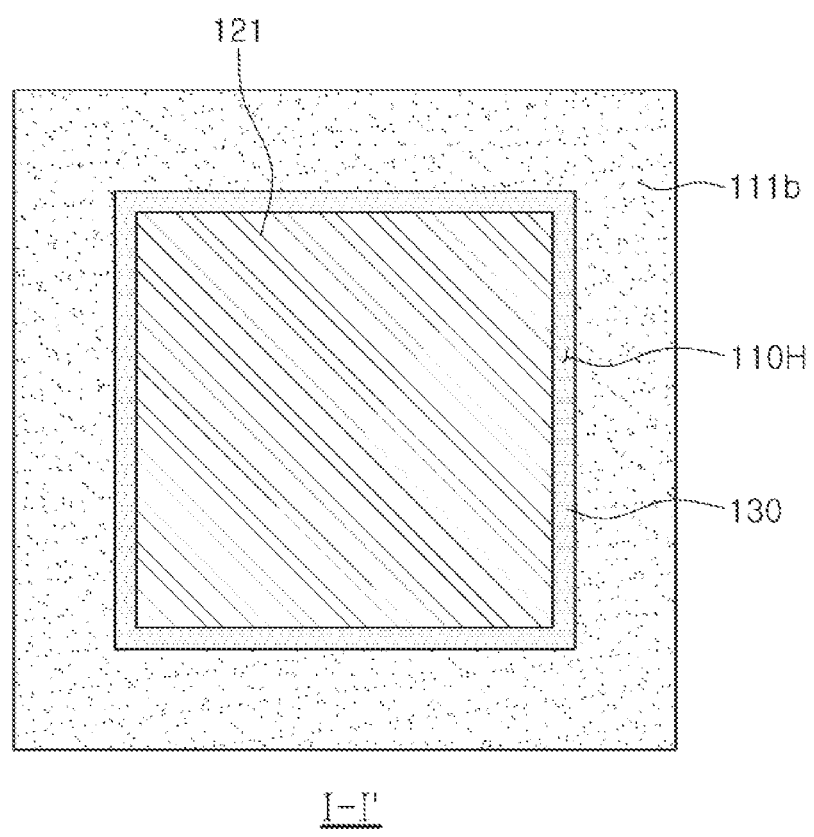
FIG. 10 is a schematic plan view taken along line I-I' of the fan-out semiconductor package of FIG. 9.
Figure 11:
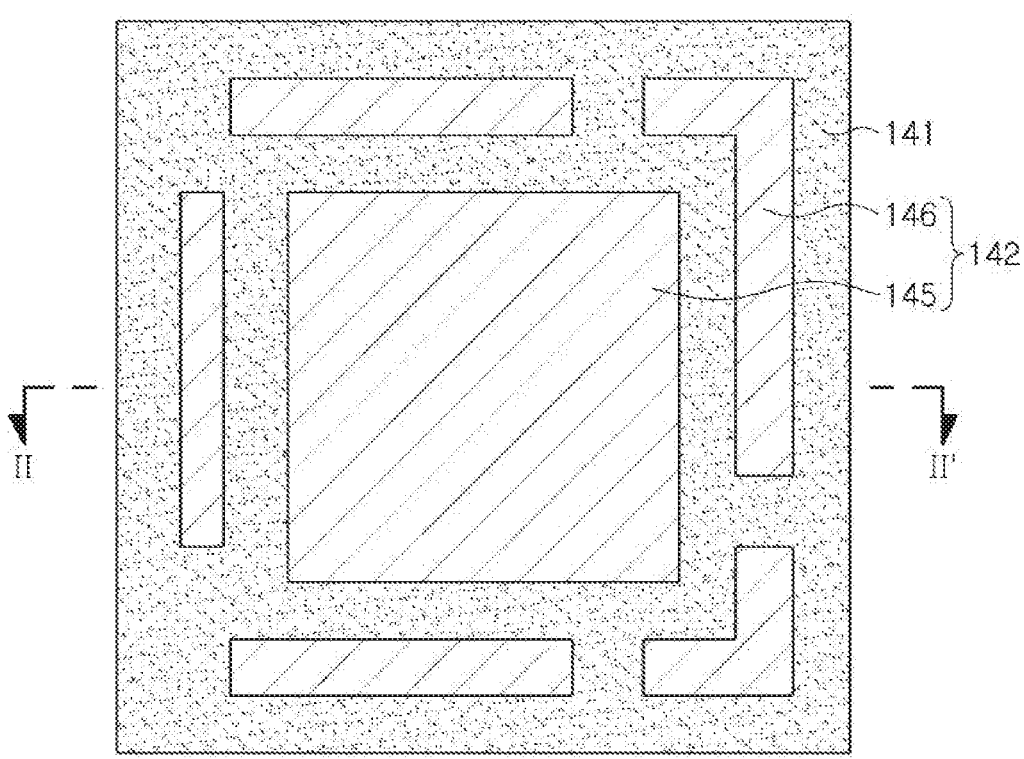
FIGS. 11 and 12 are a plan view and a cross-sectional view, respectively, illustrating an example of a redistribution layer in the fan-out semiconductor package of FIG. 9.
Figure 12:
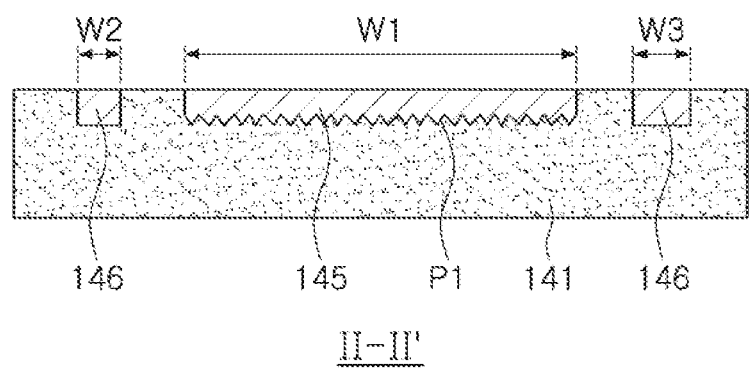
Figure 13:
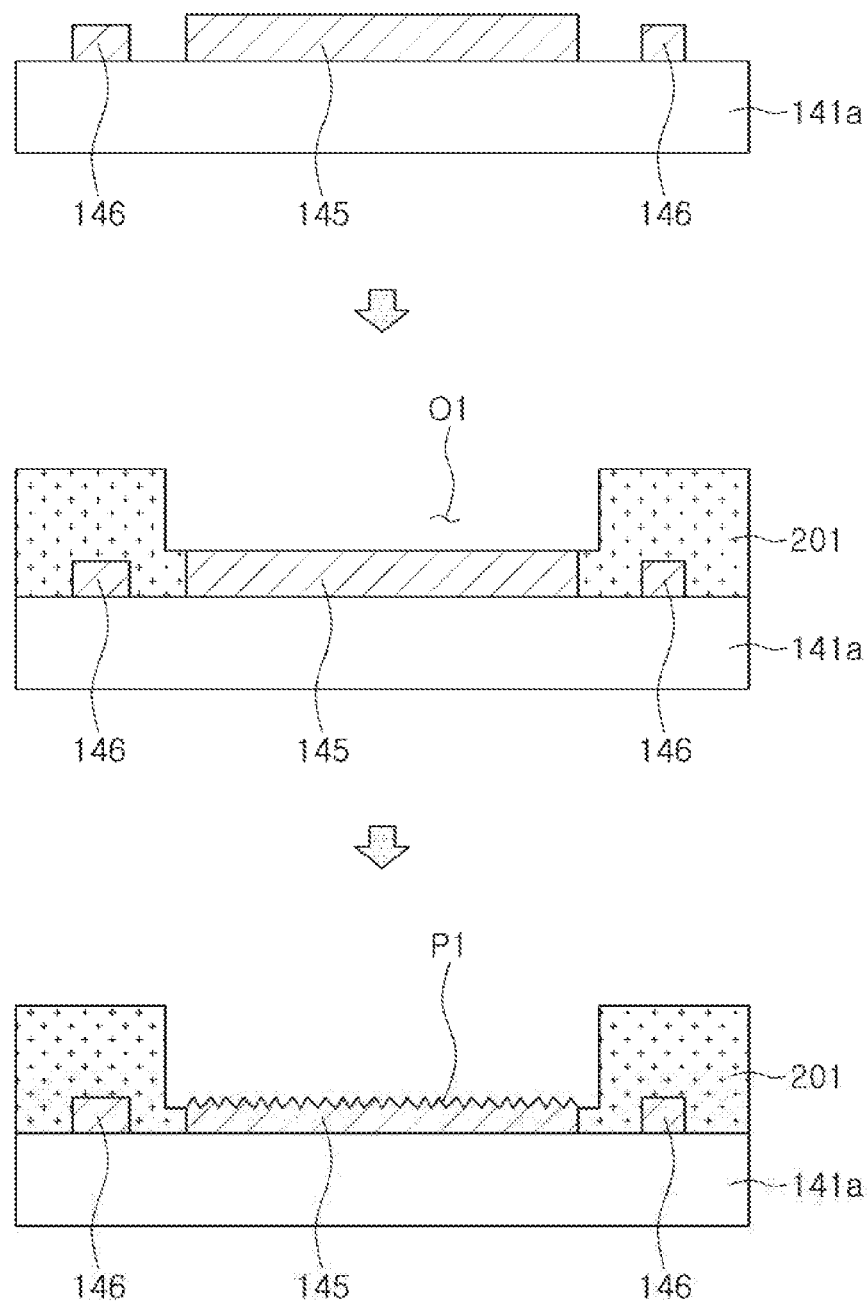
FIG. 13 illustrates an example of forming surface roughness on the redistribution layer.

FIG. 9 is a schematic cross-sectional view illustrating an example of a semiconductor package. FIG. 10 is a schematic plan view taken along line I-I' of the fan-out semiconductor package of FIG. 9. FIGS. 11 and 12 are a plan view and a cross-sectional view, respectively, illustrating an example of a redistribution layer in the fan-out semiconductor package of FIG. 9. FIG. 13 illustrates an example of forming surface roughness on the redistribution layer.

Referring to the drawings, a semiconductor package 100A according to an exemplary embodiment may include a frame 110 having a through-hole 110H, a semiconductor chip 120, an encapsulant 130, and a connection structure 140, and a relatively higher surface roughness may be formed on a conductive pattern 145 having a wider width among a plurality of conductive patterns 145 and 146 included in the connection structure 140. In addition, in addition to the components described above, the semiconductor package 100A may include a passivation layer 150, underbump metals 160, electrical connection metals 170, and the like.

The frame 110 may further improve rigidity of the semiconductor package 100A depending on certain materials, and serve to secure uniformity of a thickness of the encapsulant 130. When through-wirings, or the like, are formed in the frame 110 as in an exemplary embodiment to be described below, the semiconductor package 100A may be utilized as a package-on-package (POP) type package. According to the present exemplary embodiment, the frame 110 may have a through-hole 110H, and the semiconductor chip 120 may be disposed in the through-hole 110H. In this case, side surfaces of the semiconductor chip 120 may be surrounded by the frame 110. However, such a form is only an example and may be variously modified to have other forms, and the frame 110 may perform another function depending on such a form. The frame 110 may be omitted, if necessary, but it may be more advantageous in securing board level reliability when the semiconductor package 100A includes the frame 110. However, the frame 110 is not an essential component and may be omitted or replaced with another component according to the exemplary embodiment.

The frame 110 may include an insulating layer 111. An insulating material may be used as the material of the insulating layer 111. In this case, the insulating material may be a thermosetting resin such as an epoxy resin, a thermoplastic resin such as polyimide, a resin in which the thermosetting resin or the thermoplastic resin is mixed with inorganic filler or is impregnated together with an inorganic filler in a core material such as a glass fiber (a glass cloth or a glass fabric), for example, prepreg, Ajinomoto Build-up Film (ABF), FR-4, Bismaleimide Triazine (BT), or the like. Such a frame 110 may serve as a support member.

The semiconductor chip 120 may be an integrated circuit (IC) provided in an amount of several hundreds to several millions of elements or more integrated in a single chip. In this case, the IC may be, for example, a processor chip (more specifically, an application processor (AP)) such as a central processor (for example, a CPU), a graphic processor (for example, a GPU), a field programmable gate array (FPGA), a digital signal processor, a cryptographic processor, a micro processor, a micro controller, or the like, but is not limited thereto. That is, the IC may be a logic chip such as an analog-to-digital converter, an application-specific IC (ASIC), or the like, or a memory chip such as a volatile memory (for example, a DRAM), a non-volatile memory (for example, a ROM), a flash memory, or the like. In addition, the above-mentioned elements may also be combined with each other and be disposed.

The semiconductor chip 120 may be formed on the basis of an active wafer. In this case, a base material of a body 121 may be silicon (Si), germanium (Ge), gallium arsenide (GaAs), or the like. Various circuits may be formed on the body 121. The connection pads 122 may electrically connect the semiconductor chip 120 to other components. A material of each of the connection pads 122 may be a conductive material such as aluminum (Al), or the like. A passivation layer 123 exposing the connection pads 122 may be formed on the body 121, and may be an oxide film, a nitride film, or the like, or a double layer of the oxide film and the nitride film. A lower surface of the connection pad 122 may have a step with respect to a lower surface of the encapsulant 130 through the passivation layer 123. Resultantly, a phenomenon in which the encapsulant 130 bleeds into the lower surface of the connection pads 122 may be prevented to some extent. An insulating layer (not illustrated), and the like, may also be further disposed in other required positions. The semiconductor chip 120 may be a bare die, a redistribution layer (not illustrated) may be further formed on the active surface of the semiconductor chip 120, if necessary, and bumps (not illustrated), or the like, may be connected to the connection pads 122. Meanwhile, although the present exemplary embodiment describes an example in which one semiconductor chip 120 is used, two or more semiconductor chips may be used.

The encapsulant 130 may protect the frame 110, the semiconductor chip 120, and the like. An encapsulation form of the encapsulant 130 is not particularly limited, but may be a form in which the encapsulant 130 surrounds at least portions of the frame 110, the semiconductor chip 120, and the like. For example, the encapsulant 130 may cover the frame 110 and the inactive surface of the semiconductor chip 120, and fill spaces between walls of the through-hole 110H and the side surfaces of the semiconductor chip 120. In addition, the encapsulant 130 may also fill at least a portion of a space between the passivation layer 123 of the semiconductor chip 120 and the connection structure 140. The encapsulant 130 may fill the through-hole 110H to thus serve as an adhesive and reduce buckling of the semiconductor chip 120 depending on certain materials.

A material of the encapsulant 130 is not particularly limited. For example, an insulating material may be used as the material of the encapsulant 130. In this case, the insulating material may be a thermosetting resin such as an epoxy resin, a thermoplastic resin such as polyimide, a resin in which the thermosetting resin or the thermoplastic resin is mixed with inorganic filler, or impregnated together with inorganic filler in a core material such as a glass fiber (a glass cloth or a glass fabric), for example, prepreg, Ajinomoto Build-up Film (ABF), FR-4, Bismaleimide Triazine (BT), or the like. Alternatively, a PID resin may also be used as the insulating material. The encapsulant 130 is not an essential component and may be omitted or replaced with another component according to the exemplary embodiment.

The connection structure 140 may redistribute the connection pads 122 of the semiconductor chip 120. Several tens to several hundreds of connection pads 122 of the semiconductor chip 120 having various functions may be redistributed by the connection structure 140, and may be physically and/or electrically externally connected through the electrical connection metals 170 depending on the functions. To this end, the connection structure 140 may include redistribution layers 142a and 142b. As an example, the connection structure 140 may include a first insulating layer 141a disposed on the frame 110 and the active surface of the semiconductor chip 120, a first redistribution layer 142a disposed on the first insulating layer 141a, a first via 143a connecting the first insulating layer 141a and the connection pads 122 of the semiconductor chip 120 to each other, a second insulating layer 141b disposed on the first insulating layer 141a, a second redistribution layer 142b disposed on the second insulating layer 141b, and a second via 143b penetrating through the second insulating layer 141b and connecting the first and second redistribution layers 142a and 142b to each other. The first to third redistribution layers 142a, 142b, and 142c may be electrically connected to the connection pads 122 of the semiconductor chip 120. However, the number of redistribution layers 142a and 142b, insulating layers 141a and 141b, and vias 143a and 143b may be changed, if necessary.

An insulating material included in the insulating layers 141a and 141b may also be, for example, a photo imagable dielectric material. When the insulating layers 141a and 141b have photo imagable dielectric properties, the insulating layers 141a and 141b may be formed to have a smaller thickness, and fine pitches of the vias 143a and 143b may be achieved more easily. Each of the insulating layers 141a and 141b may be a photo imagable dielectric insulating layer including an insulating resin and inorganic filler. When the insulating layers 141a and 141b are multiple layers, the materials of the insulating layers 141a and 141b may be the same as each other, and may also be different from each other, if necessary. When the insulating layers 141a and 141b are the multiple layers, the insulating layers 141a and 141b may be integrated with each other depending on a process, such that a boundary therebetween may also not be apparent. A larger number of insulating layers than those illustrated in the drawing may be formed.

The redistribution layers 142a and 142b may serve to substantially redistribute the connection pads 122. A material of each of the redistribution layers 142a and 142b may be a conductive material such as copper (Cu), aluminum (Al), silver (Ag), tin (Sn), gold (Au), nickel (Ni), lead (Pb), titanium (Ti), or alloys thereof. The redistribution layers 142a and 142b may perform various functions depending on designs of their corresponding layers. For example, the redistribution layers 142a and 142b may include ground patterns, power patterns, power patterns, signal patterns, and the like. Here, the signal patterns may include various signals except for the ground patterns, the power patterns, and the like, such as data signals, and the like. In addition, the redistribution layers 142a and 142b may include via pad patterns, connection terminal pad patterns, and the like.

The vias 143a and 143b may electrically connect the redistribution layers 142a and 142b, the connection pads 122, or the like, formed on different layers to each other, resulting in an electrical path in the semiconductor package 100A. A material of each of the vias 143a and 143b may be a conductive material such as copper (Cu), aluminum (Al), silver (Ag), tin (Sn), gold (Au), nickel (Ni), lead (Pb), titanium (Ti), or alloys thereof. Each of the vias 143a and 143b may be completely filled with the conductive material, or the conductive material may be formed along a wall of each of the vias. In addition, each of the connection vias 143a and 143b may have all of the shapes known in the related art, such as a tapered shape, a cylindrical shape, and the like.

In the present exemplary embodiment, as shown in FIGS. 11 and 12, a redistribution layer 142 may include a plurality of conductive patterns 145 and 146, and some of the plurality of conductive patterns 145 and 146 may have different widths from each other. In FIGS. 11 and 12, the redistribution layer 142 illustrates at least one of the redistribution layers 142a, 142b, and 142c described above, and the insulating layer 141 illustrates at least one of the insulating layers 141a, 141b, and 141c described above. Here, some of the plurality of conductive patterns 145 and 146 means at least two patterns. In addition, at least two of the plurality of conductive patterns 145 and 146 may have different degrees of surface roughness, and a width W1 of the conductive pattern 145 having a higher surface roughness may be wider than widths W2 and W3 of the conductive pattern 146 having a lower surface roughness. A width of a pattern may refer to in a plan view, a smaller one of distances between opposite edges of the pattern. In this case, the plurality of conductive patterns 145 and 146 may include a signal pattern 146 and a ground pattern 145, and a surface roughness of the ground pattern 145 may be greater than a surface roughness of the signal pattern 146. In addition, as shown, a width of the ground pattern 145 may be wider than that of the signal pattern 146, and in other words, the signal pattern 146 may be implemented in a finer pattern than the ground pattern 145.

As shown in FIG. 12, an irregular (or randomly distributed) concave-convex structure P1 may be formed on a surface of the conductive pattern 145 having a higher surface roughness, and a concave-convex structure may not be formed on a surface of the conductive pattern 146 having a lower surface roughness. Here, a structure in which a concave-convex structure is not formed means that a concave-convex structure is not formed intentionally on the surface of the conductive pattern 146, and it does not mean that there is no roughness. In addition, although FIG. 12 illustrates the form in which there are no concave-convex structures on the surface of the conductive pattern 146, the conductive pattern 146 may have concave-convex structures on the surface thereof in a case in which the surface roughness of the conductive pattern 146 is lower than that of the conductive pattern 145. The irregular concave-convex structure P1 formed on the surface of the conductive pattern 145 may be a surface-etched irregular structure.

As such, in the present exemplary embodiment, by forming the concave-convex structure on the surface of the redistribution layer 142, a coupling force with the insulating layer 141 may be increased, and the surface roughness may be varied according to the width of the redistribution layer 142. As the semiconductor package 100A becomes smaller and higher in efficiency, the redistribution layer 142 becomes finer. When the entire redistribution layer 142 is surface-etched or the concave-convex structure is formed on the redistribution layer 142 by mechanical machining, the fine pattern may be damaged. In order to reduce such a problem, in the present exemplary embodiment, the surface roughness of the conductive pattern 145 having a relatively wider width of the redistribution layer 142 is increased, and the surface roughness of the conductive pattern 146 having a narrower width is decreased by using a method in which the concave-convex structure is not formed, or the like, and as a result, the coupling force with the insulating layer 141 may be improved and damage on the redistribution layer 142 may be reduced. The conductive pattern 145 having a higher surface roughness may have a flat plate shape and may be less damaged even if the concave-convex structure P1 is formed thereon. As described above, such a conductive pattern 145 may be the ground pattern, and the conductive pattern 146 having the narrow width may be a signal pattern or a power supply pattern.

As shown in FIG. 12, a surface (a lower surface in FIG. 12) of the conductive pattern 145 having the higher surface roughness on which the surface roughness is formed may be in contact with the insulating layer 141, and a surface (an upper surface in FIG. 12) opposing the surface on which the surface roughness is formed may have lower or substantially no surface roughness. In this case, the surface of the conductive pattern 145 having the higher surface roughness on which the surface roughness is formed may be disposed further from the semiconductor chip 120 than the opposing surface.

FIG. 13 illustrates a method of forming a concave-convex structure on the conductive patterns 145 and 146 included in the redistribution layer, and specifically, a method of forming surface-etched concave-convex structure P1 only on the conductive pattern 145 having the larger width. After the conductive patterns 145 and 146 are formed on the insulating layer 141a, a mask pattern 201 may be formed. Here, an opened region O1 of the mask pattern 201 may expose only the conductive pattern 145 having the large width. The surface roughness of the conductive pattern 145 may be increased by forming the concave-convex structure P1 on the conductive pattern 145 opened as described above by a chemical and mechanical machining method. In this case, since the conductive pattern 146 corresponding to the fine pattern is protected, the damage may be reduced. After removing the mask pattern 201, an insulating layer 141b is formed to cover the conductive patterns 145 and 146 and portions of the insulating layer 141a. A coupling force between the insulating layer 141b and the conductive pattern 145 having the concave-convex structure P1 therebetween may be improved.

Other components will be described with reference to FIG. 9. The passivation layer 150 may protect the connection structure 140 from external physical or chemical damage. The passivation layer 150 may have openings 151 exposing at least portions of the redistribution layers 142a and 142b of the connection structure 140. The number of openings 151 formed in the passivation layer 150 may be several tens to several thousands. A material of the passivation layer 150 is not particularly limited. For example, an insulating material may be used as the material of the passivation layer 150. In this case, the insulating material may be a thermosetting resin such as an epoxy resin, a thermoplastic resin such as polyimide, a resin in which the thermosetting resin or the thermoplastic resin is mixed with inorganic filler, or impregnated together with inorganic filler in a core material such as a glass fiber (a glass cloth or a glass fabric), for example, prepreg, Ajinomoto Build-up Film (ABF), FR-4, Bismaleimide Triazine (BT), or the like. Alternatively, a solder resist may also be used.

The underbump metals 160 may improve connection reliability of the electrical connection metals 170 to improve board level reliability of the semiconductor package 100A. The underbump metals 160 may be connected to the redistribution layers 142a and 142b of the connection structure 140 exposed through the openings 151 of the passivation layer 150. The underbump metals 160 may be formed in the openings 151 of the passivation layer 150 by the known metallization method using the known conductive material such as a metal, but are not limited thereto.

The electrical connection metals 170 may physically and/or electrically externally connect the semiconductor package 100A. For example, the semiconductor package 100A may be mounted on a main board of the electronic device through the electrical connection metals 170. Each of the electrical connection metals 170 may be formed of a conductive material, for example, a solder, or the like. However, this is only an example, and a material of each of the electrical connection metals 170 is not particularly limited thereto. Each of the electrical connection metals 170 may be a land, a ball, a pin, or the like. The electrical connection metals 170 may be formed as a multilayer or single layer structure. When the electrical connection metals 170 are formed as a multilayer structure, the electrical connection metals 170 may include a copper (Cu) pillar and a solder. When the electrical connection metals 170 are formed as a single layer structure, the electrical connection metals 170 may include a tin-silver solder or copper (Cu). However, this is only an example, and the electrical connection metals 170 are not limited thereto.

The number, an interval, a disposition form, and the like, of electrical connection metals 170 are not particularly limited, but may be sufficiently modified depending on design particulars by those skilled in the art. For example, the electrical connection metals 170 may be provided in an amount of several tens to several thousands according to the number of connection pads 122, or may also be provided in an amount of several tens to several thousands or more or several tens to several thousands or less. When the electrical connection metal 170 are solder balls, the electrical connection metals 170 may cover side surfaces of the underbump metals 160 extending onto one surface of the passivation layer 150, and connection reliability may be more excellent.

At least one of the electrical connection metals 170 may be disposed in a fan-out region. The fan-out region is a region except for a region in which the semiconductor chip 120 is disposed. The fan-out package may have reliability greater than that of a fan-in package, may implement a plurality of I/O terminals, and may easily perform 3D interconnection. In addition, as compared to a ball grid array (BGA) package, a land grid array (LGA) package, or the like, the package may be manufactured to have a small thickness, and may have price competitiveness.

Meanwhile, although not illustrated in the drawings, a metal thin film may be formed on the walls of the through-hole 110H, if necessary, in order to radiate heat or block electromagnetic waves. In addition, a plurality of semiconductor chips 120 performing functions that are the same as or different from each other may be disposed in the through-hole 110H, if necessary. In addition, a separate passive component such as an inductor, a capacitor, or the like, may be disposed in the through-hole 110H, if necessary. In addition, a passive component, for example, a surface mounted technology (SMT) component including an inductor, a capacitor, or the like, may be disposed on a surface of the passivation layer 150, if necessary.

Figure 14:
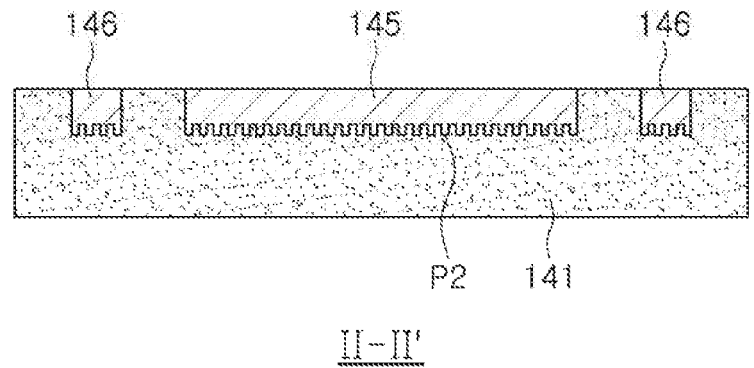
FIG. 14 schematically illustrates a redistribution layer which may be used in a semiconductor package according to another exemplary embodiment in the present disclosure.

Another exemplary embodiment will be described with reference to FIG. 14. In an exemplary embodiment of FIG. 14, unlike the exemplary embodiment described above, a regular concave-convex structure P2 is formed on surfaces of the conductive patterns 145 and 146 in contact with the insulating layer 141 irrespective of a plurality of conductive patterns 145 and 146, and as a result, a coupling force with the insulating layer 141 may be increased. In other words, the regular concave-convex structure P2 may be formed not only on the conductive pattern 145 having the wider width but also on the conductive pattern 146 having the narrower width. Here, a case in which the shape of each of the regular concave-convex structure P2 is regular may include a case in which a size of each of the regular concave-convex structure P2 is the same throughout the entire area and the regular concave-convex structure P2 of the same size or shape are repeated in a predetermined section while forming one pattern.

In this case, considering that the regular concave-convex structure needs to be formed on the surface of the conductive pattern 146 which is the fine pattern, the size of the regular concave-convex structure P2 may be 1 μm or less. As shown, a surface (an upper surface in FIG. 14) opposing the surfaces of the plurality of conductive patterns 145 and 146 on which the regular concave-convex structure P2 is formed may not include a regular concave-convex structure. In addition, the surfaces (lower surfaces in FIG. 14) of the plurality of conductive patterns 145 and 146 on which the regular concave-convex structure P2 are formed may be disposed further from the semiconductor chip 120 than the opposing surface.

Figure 15:
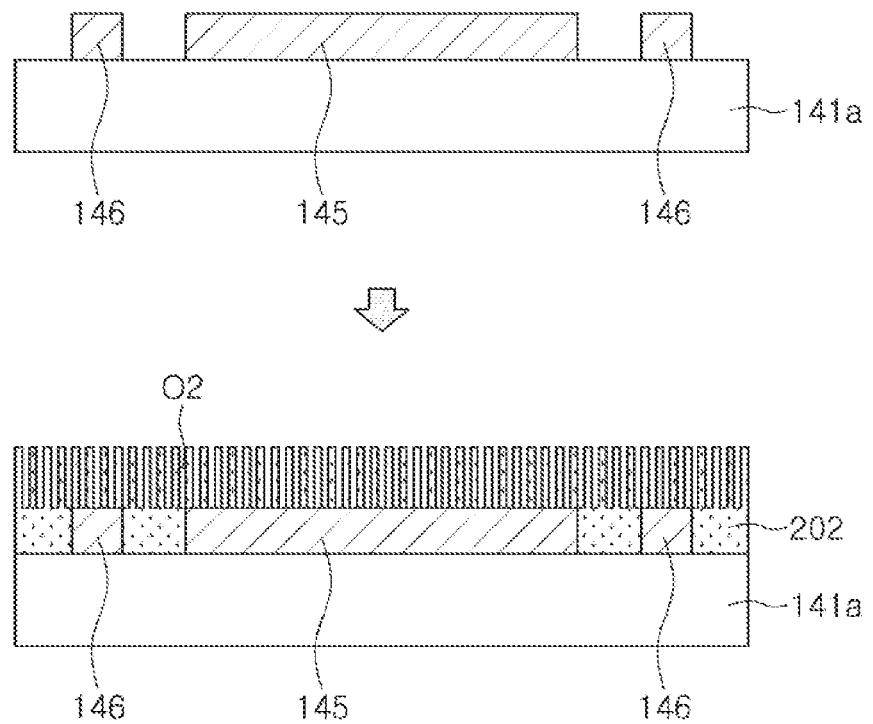
FIG. 15 illustrates another example of forming surface roughness on the redistribution layer.

FIG. 15 illustrates an example in which regular concave-convex structure P2 is formed on the surfaces of the plurality of conductive patterns 145 and 146. A mask pattern 202 having a fine opened region O2 is used to expose upper surfaces of the plurality of conductive patterns 145 and 146, and for example, the opened region O2 may be formed in a lattice pattern, or the like. The regular concave-convex structure P2 may be formed by performing a chemical and mechanical machining for the conductive patterns 145 and 146 exposed through the opened region O2.

As in the present exemplary embodiment, by forming the regular concave-convex structure P2 irrespective of the widths of the plurality of conductive patterns 145 and 146, the coupling force with the insulating layer 141 may be further improved. In addition, since the size and shape of the opened region O2 may be adjusted to have a regular pattern in consideration of the width of the conductive pattern 146, which is the fine pattern, damage on the conductive pattern 146 having the narrower width may be significantly reduced and the regular concave-convex structure P2 may be formed on the surface of the conductive pattern 146. The size of the regular concave-convex structure P2 implemented as described above may be1 μm or less. Here, the size of each of the regular concave-convex structure P2 may be defined as a width of a convex portion or a concave portion of the regular concave-convex structure P2.

A semiconductor package according to another exemplary embodiment in the present disclosure will be described with reference to FIGS. 16 and 17, and the same portions as those of the exemplary embodiment described above will be omitted. In the following exemplary embodiments, the plurality of conductive patterns included in the redistribution layer may have surface roughness conditions or regular concave-convex structure as described above.

Figure 16:
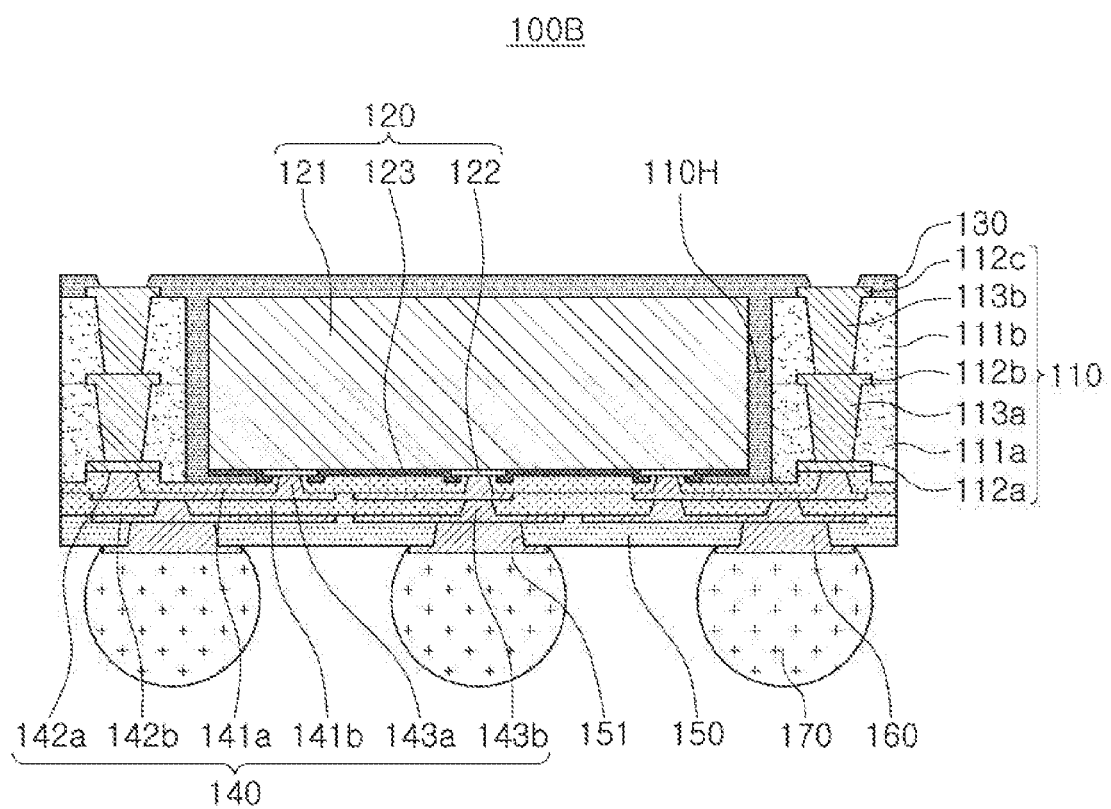
FIGS. 16 and 17 are cross-sectional views illustrating other examples of a semiconductor package.
Figure 17:
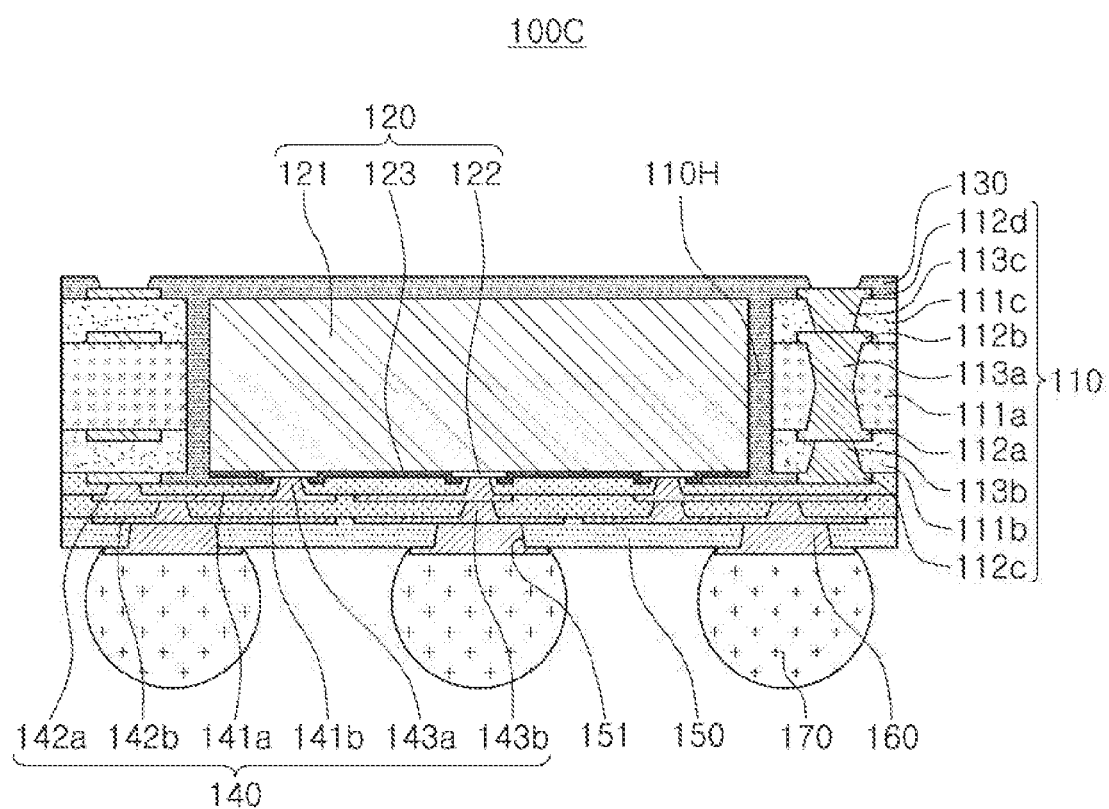

In a semiconductor package 100B according to an exemplary embodiment of FIG. 16, a plurality of conductive vias serving to perform interlayer electricity conduction may be installed in the frame 110. In detail, the frame 110 may include a first insulating layer 111a in contact with the connection structure 140, a first wiring layer 112a in contact with the connection structure 140 and embedded in the first insulating layer 111a, a second wiring layer 112b disposed on the other surface of the first insulating layer 111a opposing one surface of the first insulating layer 111a in which the first wiring layer 112a is embedded, a second insulating layer 111b disposed on the first insulating layer 111a and covering the second wiring layer 112b, and a third wiring layer 112c disposed on the second insulating layer 111b. The first to third wiring layers 112a, 112b, and 112c may be electrically connected to connection pads 122. The first and second wiring layers 112a and 112b and the second and third wiring layers 112b and 112c may be electrically connected to each other through first and second vias 113a and 113b penetrating through the first and second insulating layers 111a and 111b, respectively.

When the first wiring layer 112a is embedded in the first insulating layer 111a, a step generated due to a thickness of the first wiring layer 112a may be significantly reduced, and an insulating distance of the connection structure 140 may thus become constant. That is, a difference between a distance from the first redistribution layer 142a of the connection structure 140 to a lower surface of the first insulating layer 111a and a distance from the first redistribution layer 142a of the connection structure 140 to the connection pad 122 of semiconductor chip 120 may be smaller than a thickness of the first wiring layer 112a. Therefore, a high density wiring design of the connection structure 140 may be easy.

As shown, the lower surface of the first wiring layer 112a of the frame 110 may be disposed on a level above a lower surface of the connection pad 122 of the semiconductor chip 120. In addition, a distance between the first redistribution layer 142a of the connection structure 140 and the first wiring layer 112a of the frame 110 may be greater than that between the first redistribution layer 142a of the connection structure 140 and the connection pad 122 of the semiconductor chip 120. The reason is that the first wiring layer 112a may be recessed into the first insulating layer 111a. As described above, when the first wiring layer 112a is recessed into the first insulating layer 111a, such that the lower surface of the first insulating layer 111a and the lower surface of the first wiring layer 112a have a step therebetween, a phenomenon in which a material of the encapsulant 130 bleeds to pollute the first wiring layer 112a may be prevented. The second wiring layer 112b of the frame 110 may be disposed between an active surface and an inactive surface of the semiconductor chip 120. The frame 110 may be formed at a thickness corresponding to that of the semiconductor chip 120. Therefore, the second wiring layer 112b formed in the frame 110 may be disposed on a level between the active surface and the inactive surface of the semiconductor chip 120.

Thicknesses of the wiring layers 112a, 112b, and 112c of the frame 110 may be greater than those of the redistribution layers 142a and 142b of the connection structure 140. Since the frame 110 may have a thickness equal to or greater than that of the semiconductor chip 120, the wiring layers 112a, 112b, and 112c may be formed at larger sizes depending on a scale of the frame 110. On the other hand, the redistribution layers 142a and 142b of the connection structure 140 may be formed at sizes relatively smaller than those of the wiring layers 112a, 112b, and 112c for thinness.

A material of each of the insulating layers 111a and 111b is not particularly limited. For example, an insulating material may be used as the material of the insulating layers 111a and 111b. In this case, the insulating material may be a thermosetting resin such as an epoxy resin, a thermoplastic resin such as polyimide, a resin in which the thermosetting resin or the thermoplastic resin is mixed with inorganic filler, or impregnated together with inorganic filler in a core material such as a glass fiber (a glass cloth or a glass fabric), for example, prepreg, Ajinomoto Build-up Film (ABF), FR-4, Bismaleimide Triazine (BT), or the like. Alternatively, a PID resin may also be used as the insulating material.

The wiring layers 112a, 112b, and 112c may serve to redistribute the connection pads 122 of the semiconductor chip 120A. A material of each of the wiring layers 112a, 112b, and 112c may be a conductive material such as copper (Cu), aluminum (Al), silver (Ag), tin (Sn), gold (Au), nickel (Ni), lead (Pb), titanium (Ti), or alloys thereof. The wiring layers 112a, 112b, and 112c may perform various functions depending on designs of their corresponding layers. For example, the wiring layers 112a, 112b, and 112c may include ground patterns, power patterns, signal patterns, and the like. Here, the signal patterns may include various signals except for the ground patterns, the power patterns, and the like, such as data signals, and the like. In addition, the wiring layers 112a, 112b, and 112c may include via pads, wire pads, connection terminal pads, and the like.

The vias 113a and 113b may electrically connect the wiring layers 112a, 112b, and 112c formed on different layers to each other, resulting in an electrical path in the frame 110. A material of each of the vias 113a and 113b may be a conductive material. Each of the vias 113a and 113b may be completely filled with a conductive material, or a conductive material may be formed along a wall of each of via holes. In addition, each of the vias 113a and 113b may have all of the shapes known in the related art, such as a tapered shape, a cylindrical shape, and the like. When holes for the first vias 113a are formed, some of the pads of the first wiring layer 112a may serve as a stopper, and it may thus be advantageous in a process that each of the first vias 113a has the tapered shape of which a width of an upper surface is greater than that of a lower surface. In this case, the first via 113a may be integrated with pad patterns of the second wiring layer 112b. In addition, when holes for the second vias 113b are formed, some of the pads of the second wiring layer 112b may serve as a stopper, and it may thus be advantageous in a process that each of the second vias 113b has the tapered shape of which a width of an upper surface is greater than that of a lower surface. In this case, the second vias 113b may be integrated with pad patterns of the third wiring layer 112c.

Next, a semiconductor package 100C according to another modified example illustrated in FIG. 17 will be described. In the semiconductor package 100C, a frame 110 may include a first insulating layer 111a, a first wiring layer 112a and a second wiring layer 112b disposed on opposite surfaces of the first insulating layer 111a, respectively, a second insulating layer 111b disposed on the first insulating layer 111a and covering the first wiring layer 112a, a third wiring layer 112c disposed on the second insulating layer 111b, a third insulating layer 111c disposed on the first insulating layer 111a and covering the second wiring layer 112b, and a fourth wiring layer 112d disposed on the third insulating layer 111c. The first to fourth wiring layers 112a, 112b, 112c, and 112d may be electrically connected to connection pads 122. Since the frame 110 may include a large number of wiring layers 112a, 112b, 112c, and 112d, a connection structure 140 may be further simplified. Therefore, a decrease in a yield depending on a defect occurring in a process of forming the connection structure 140 may be suppressed. Meanwhile, the first to fourth wiring layers 112a, 112b, 112c, and 112d may be electrically connected to each other through first to third vias 113a, 113b, and 113c respectively penetrating through the first to third insulating layers 111a, 111b, and 111c.

The first insulating layer 111a may have a thickness greater than those of the second insulating layer 111b and the third insulating layer 111c. The first insulating layer 111a may be basically relatively thick in order to maintain rigidity, and the second insulating layer 111b and the third insulating layer 111c may be introduced in order to form a larger number of wiring layers 112c and 112d. The first insulating layer 111a may include an insulating material different from those of the second insulating layer 111b and the third insulating layer 111c. For example, the first insulating layer 111a may be, for example, prepreg including a core material, a filler, and an insulating resin, and the second insulating layer 111b and the third insulating layer 111c may be an ABF or a PID film including a filler and an insulating resin. However, the materials of the first insulating layer 111a and the second and third insulating layers 111b and 111c are not limited thereto. Similarly, the first vias 113a penetrating through the first insulating layer 111a may have a diameter greater than those of second vias 113b and third vias 113c penetrating through the second and the third insulating layers 111b and 111c, respectively.

A lower surface of the third wiring layer 112c of the frame 110 may be disposed on a level below a lower surface of the connection pad 122 of the semiconductor chip 120. In addition, a distance between the first redistribution layer 142a of the connection structure 140 and the third wiring layer 112c of the frame 110 may be smaller than that between the first redistribution layer 142a of the connection structure 140 and the connection pad 122 of the semiconductor chip 120. The reason is that the third wiring layer 112c may be disposed in a protruding form on the second insulating layer 111b, resulting in being in contact with the connection structure 140. The first wiring layer 112a and the second wiring layer 112b of the frame 110 may be disposed between an active surface and an inactive surface of the semiconductor chip 120. The frame 110 may be formed at a thickness corresponding to that of the semiconductor chip 120. Therefore, the first wiring layer 112a and the second wiring layer 112b formed in the frame 110 may be disposed on the level between the active surface and the inactive surface of the semiconductor chip 120.

Thicknesses of the wiring layers 112a, 112b, 112c, and 112d of the frame 110 may be greater than those of the redistribution layers 142a and 142b of the connection structure 140. Since the frame 110 may have a thickness equal to or greater than that of the semiconductor chip 120, the wiring layers 112a, 112b, 112c, and 112d may also be formed at larger sizes. On the other hand, the redistribution layers 142a and 142b of the connection structure 140 may be formed at relatively small sizes for thinness.

Herein, a lower side, a lower portion, a lower surface, and the like, are used to refer to a direction toward amounted surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first component may be named a second component and a second component may also be similarly named a first component, without departing from the scope of the present disclosure.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

As set forth above, according to the exemplary embodiment in the present disclosure, the semiconductor package in which the coupling force between the wiring layer and the insulating layer is improved and structural stability may be improved may be provided.

While exemplary embodiments have been shown and described above, it will be apparent to those skilled in the art that modifications and variations could be made without departing from the scope of the present invention as defined by the appended claims.

What is claimed is:

1. A semiconductor package comprising:
   a semiconductor chip; and
   a connection structure disposed on at least one side of the semiconductor chip, and including a first insulating layer and a redistribution layer electrically connected to the semiconductor chip,
   wherein the redistribution layer includes a plurality of conductive patterns,
   at least two of the plurality of conductive patterns have different degrees of surface roughness, and a conductive pattern having a higher surface roughness has a width wider than a width of a conductive pattern having a lower surface roughness, and
   only a first surface of the conductive pattern having the higher surface roughness among the first surface of the conductive pattern having the higher surface roughness and a second surface, that faces in a same direction as the first surface, of the conductive pattern having the lower surface roughness has a concave-convex structure, the concave-convex structure of the first surface being an irregular concave-convex structure.

2. The semiconductor package of claim 1, wherein the plurality of conductive patterns include a signal pattern and a ground pattern, and a surface roughness of the ground pattern is greater than a surface roughness of the signal pattern.

3. The semiconductor package of claim 1, wherein the irregular concave-convex structure is a surface-etched irregular structure.

4. The semiconductor package of claim 1, wherein the first surface of the conductive pattern having the higher surface roughness is in contact with the first insulating layer.

5. The semiconductor package of claim 4, wherein a surface roughness of a surface opposing the first surface of the conductive pattern having the higher surface roughness is lower than the surface roughness of the first surface of the conductive pattern having the higher surface roughness.

6. The semiconductor package of claim 5, wherein the first surface of the conductive pattern having the higher surface roughness is disposed further from the semiconductor chip than the opposing surface.

7. The semiconductor package of claim 5, wherein the first surface of the conductive pattern having the higher surface roughness and side surfaces of the conductive pattern having the higher surface roughness are embedded in the first insulating layer, and the opposing surface is in contact with a second insulating layer of the connection structure.

8. The semiconductor package of claim 1, wherein the conductive pattern having the higher surface roughness has a flat plate shape.

9. A semiconductor package comprising:
a semiconductor chip; and
a connection structure disposed on at least one side of the semiconductor chip, and including a first insulating layer and a redistribution layer electrically connected to the semiconductor chip, wherein the redistribution layer includes a plurality of conductive patterns, at least portions of surfaces of the plurality of conductive patterns which are in contact with the first insulating layer have a regular concave-convex structure, at least one of the plurality of conductive patterns is a ground pattern that is connected to a ground terminal of the semiconductor chip, a largest concave-convex structure on the each of the portions of the surfaces of the plurality of conductive patterns, including the ground pattern, is the regular concave-convex structure, and a size of the largest concave-convex structure is 1µm or less.

10. The semiconductor package of claim 9, wherein a surface opposing surfaces of the plurality of conductive patterns which have the regular concave-convex structure does not include a regular concave-convex structure.

11. The semiconductor package of claim 10, wherein the surfaces of the plurality of conductive patterns which have the regular concave-convex structure are disposed further from the semiconductor chip than the opposing surface.

12. The semiconductor package of claim 10, wherein the surfaces of the plurality of conductive patterns which have the regular concave-convex structure, and side surfaces of the plurality of conductive patterns are embedded in the first insulating layer, and the opposing surface is in contact with a second insulating layer of the connection structure.

* * * * *